(12) United States Patent
Wei (10) Patent No.: US 7,209,351 B2
(45) Date of Patent: Apr. 24, 2007

(54) TELECOM EQUIPMENT CHASSIS USING MODULAR AIR COOLING SYSTEM

(75) Inventor: Wen Wei, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 339 days.

(21) Appl. No.: 10/883,494

(22) Filed: Jun. 30, 2004

(65) Prior Publication Data

US 2006/0002084 A1    Jan. 5, 2006

(51) Int. Cl.
*H05K 7/20* (2006.01)

(52) U.S. Cl. ............... 361/695; 361/721; 361/727; 454/184

(58) Field of Classification Search ............ None
See application file for complete search history.

(56) References Cited

U.S. PATENT DOCUMENTS

| | | | | |
|---|---|---|---|---|
| 6,053,808 A | * | 4/2000 | Koradia et al. | 454/184 |
| 6,075,698 A | * | 6/2000 | Hogan et al. | 361/695 |
| 6,081,425 A | * | 6/2000 | Cheng | 361/704 |
| 6,088,223 A | * | 7/2000 | Diemunsch | 361/690 |
| 6,104,003 A | * | 8/2000 | Jones | 219/400 |
| 6,244,953 B1 | * | 6/2001 | Dugan et al. | 454/184 |
| 6,297,958 B1 | * | 10/2001 | Lutz, Jr. | 361/690 |
| 6,449,150 B1 | * | 9/2002 | Boone | 361/694 |
| 6,867,966 B2 | * | 3/2005 | Smith et al. | 361/687 |
| 6,876,549 B2 | * | 4/2005 | Beitelmal et al. | 361/692 |
| 6,932,443 B1 | * | 8/2005 | Kaplan et al. | 312/213 |
| 7,048,498 B2 | * | 5/2006 | Kosugi | 415/118 |

* cited by examiner

*Primary Examiner*—Boris Chervinsky
(74) *Attorney, Agent, or Firm*—Blakely, Sokoloff, Taylor & Zafman LLP (57) ABSTRACT

This application discloses an apparatus comprising a chassis comprising a box having a perforated top, a perforated bottom and four sidewalls, wherein at least two on the sidewalls have air vents therein near the bottom, a modular fan assembly removably coupled to the top of the chassis, and a retention mechanism to removably secure the modular fan assembly to the chassis. Also disclosed is a process comprising providing a chassis including one or more server blades therein, each server blade having a power consumption, if the power consumption of each blade is below a threshold power consumption, cooling the blades using natural convection, and if the power consumption of each blade is above a threshold power consumption, cooling the blades using forced convection. Other embodiments are disclosed and claimed.

33 Claims, 7 Drawing Sheets

TELECOM EQUIPMENT CHASSIS USING MODULAR AIR COOLING SYSTEM

TECHNICAL FIELD

The present invention relates generally to telecommunications servers and in particular, but not exclusively, to servers utilizing a modular fan assembly to provide cooling.

BACKGROUND

Most electronic devices such as servers, computers and the like, are made up of various electronic components within some sort of metal box or chassis. In particular, many servers now fit on individual circuit boards known as "blades" and are placed within a chassis conforming to the Advanced Telecom Computing Architecture (ATCA) 3.0 standard, published January 2003. The ATCA standard defines an open switch fabric-based platform delivering an industry standard high performance, fault tolerant, and scalable solution for next generation telecommunications and data center equipment. The development of the ATCA standard is overseen by the PCI Industrial Computer Manufacturers Group (PICMG)—the same group that created the highly successful Compact PCI standard. The ATCA 3.0 base specification defines the physical and electrical characteristics of an off-the-shelf, modular chassis based on switch fabric connections between hot-swappable blades. Specifically, the ATCA 3.0 base specification defines the frame (rack) and shelf (chassis) form factors, core backplane fabric connectivity, power, cooling, management interfaces, and the electromechanical specification of the ATCA-compliant boards. The ATCA 3.0 base specification also defines a power budget of 200 Watts (W) per slot, enabling high performance servers with multi-processor architectures and multi gigabytes of on-board memory.

During operation, each blade's components generate heat. If the blades are low-power blades, then natural convection may be sufficient to provide adequate cooling to maintain the blades within specified temperatures. If the blades are high-power blades, however, natural convection may not be enough to keep the blades cool and forced convection may be necessary. Existing form factors for low-power blades are not set up to accommodate forced convection, meaning that an upgrade in the blade power usually requires a change of form factor to one that can accommodate forced convection. Existing form factors for high-power blades have substantial forced convection built into them, but it is far more than is needed for low power solution. Because neither form factor is suitable for both high- and low-powered blades the ability to tailor a system to customer requirements is hampered.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus and method for cooling a server including one or more server blades are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
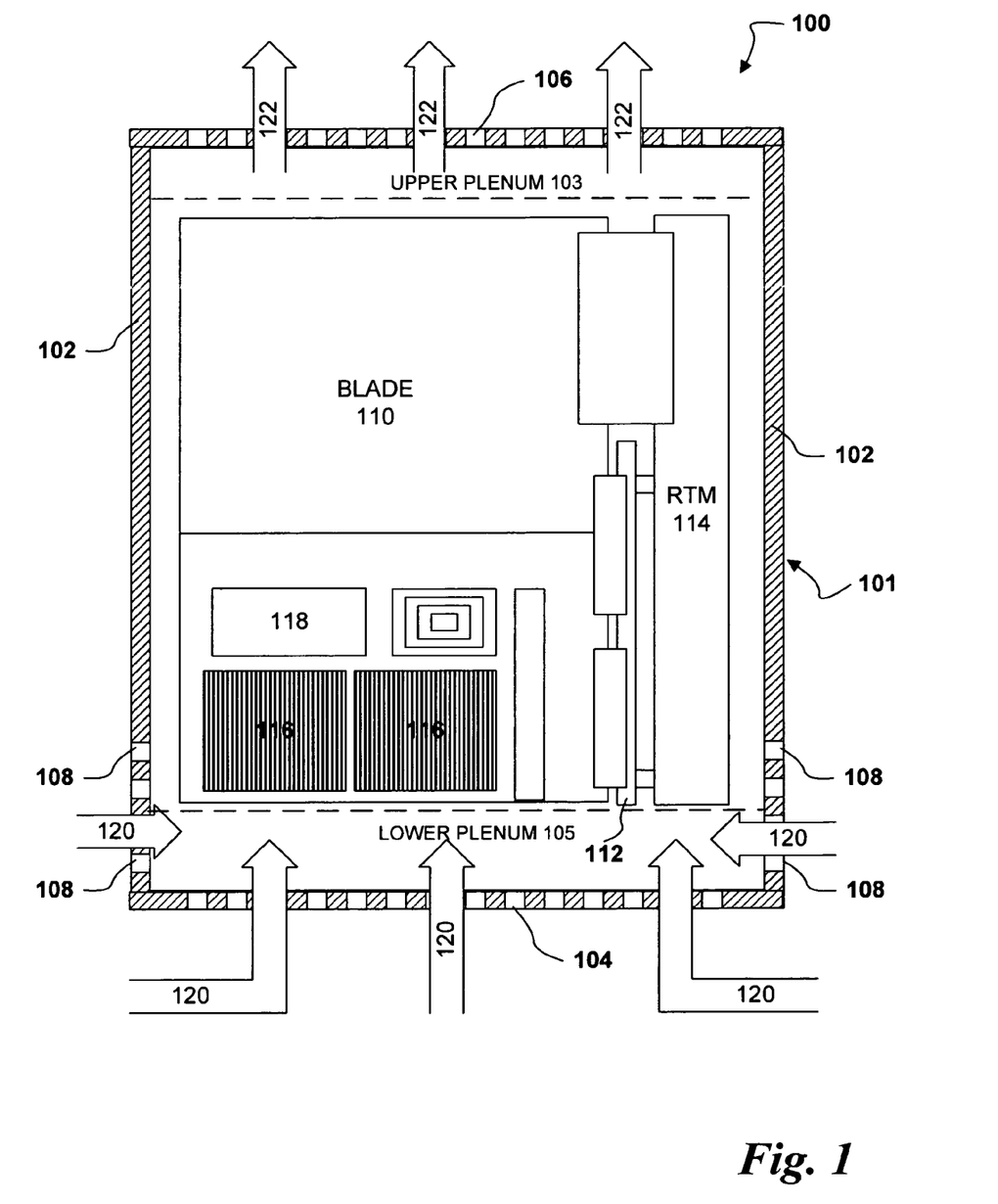
FIG. 1 is a side elevation of an embodiment of a server cooled by natural convection.

FIG. 1 illustrates an embodiment of a server 100. Although the server 100 is referred to in the singular, it can actually include many separate servers, each on its own blade. The server 100 includes a chassis 101 within which are found the electronic components that make up the server. In the illustrated embodiment, the chassis 101 is a chassis conforming to the ATCA form factor specification and includes a metal box with a perforated top 106, a perforated bottom 104 and four sidewalls 102. Within the chassis 101, a bottom plenum 105 is located below the components, while a top plenum 103 is located above the components. At least two of the sidewalls 102 include air vents 108 that allow cool air into the bottom plenum 105. Other embodiments of the chassis 101, however, may have different configurations of air vents 108 in the sidewalls. Similarly, other embodiments of the chassis may be made of materials besides metals.

The electronic components inside the chassis include one or more individual servers, each on a separate blade 110. Each blade 110 is a low-power blade, meaning that its power consumption is at or below a certain threshold. In one embodiment, the threshold can be set at 65 W, although in other embodiments the threshold that distinguishes a low-power blade from a high-power blade may be set differently. The blade 110 includes, for example, processor chipset 116 and a memory 118, which can be a volatile memory such as dynamic random access memory (DRAM) or synchronous dynamic random access memory (SDRAM), or can be a non-volatile memory such as flash read-only memory (ROM), disk storage, or other components. In one embodiment, the processors 116 can have heat sinks attached thereto to improve heat transfer. The blades 110 plug into a backplane 112, which provides interconnects for communication protocols, management interfaces and system power to all modules and devices. The optional Rear Transition Module (RTM) 114 provides optional additional connections and functionality separate from the backplane. The backplane 112, blades 110 and RTM 114 are vertically oriented in the chassis.

In operation, each blade 110 generates heat. The blades 110 are cooled by air flowing through the chassis 101 by natural convection. Cooling air 120 enters the bottom plenum 105 through the side vents 108 and the perforated bottom 120, and moves upward so that it flows over the blades 110. The cooling air 120 is heated as it passes over the blades 110 and rises due to buoyancy forces, creating a flow of air from bottom to top known as the "chimney effect." After flowing over the blades 110, heated air 122 flows into the upper plenum 103 and exits the chassis through perforated top 106.

Figure 2:
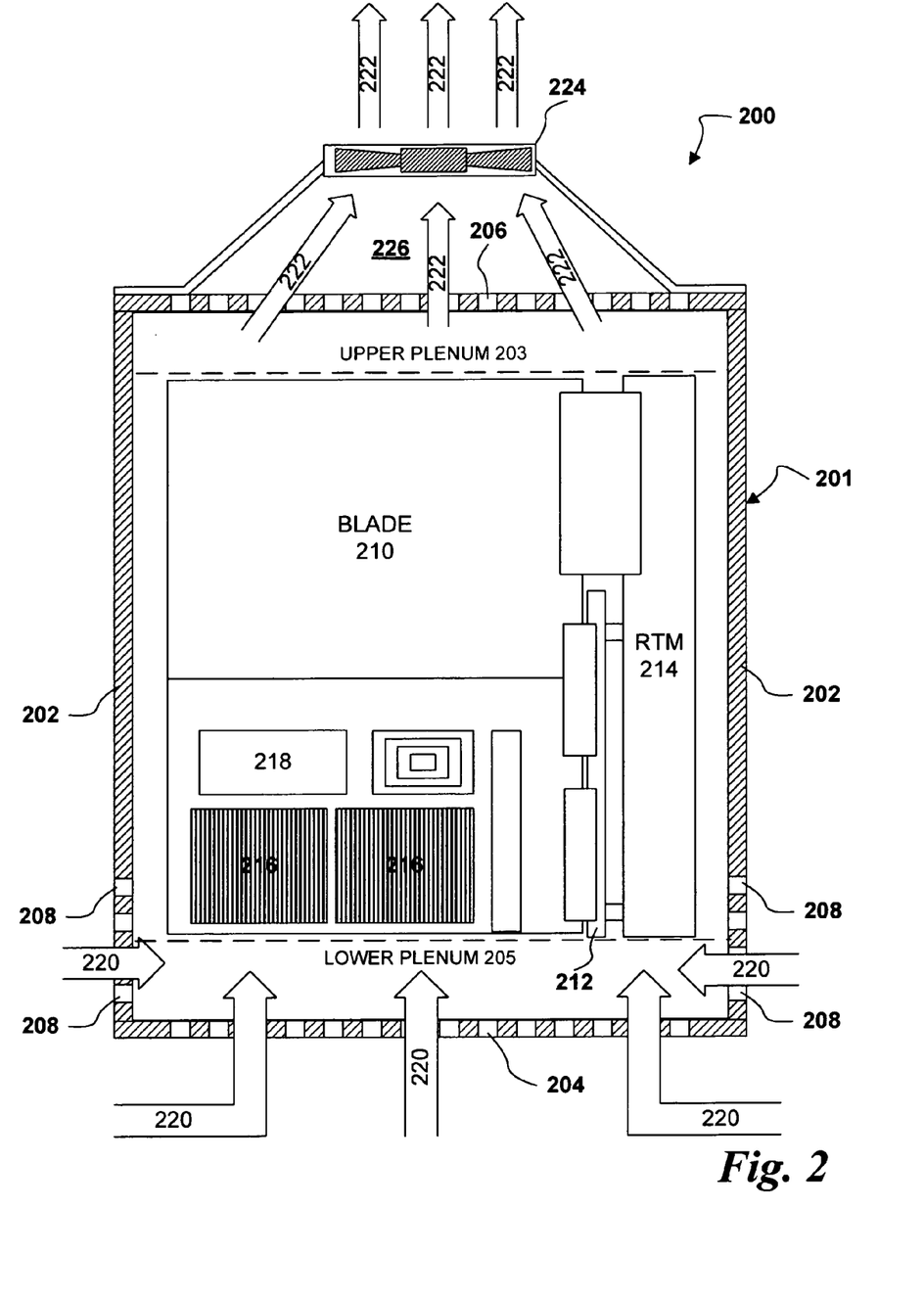
FIG. 2 is a side elevation of an embodiment of a server cooled by forced convection according to the present invention.

FIG. 2 illustrates an embodiment of the invention comprising a server 200. As with the server 100, the server 200 includes a chassis 201 within which are found the electronic components that make up the server. The primary difference between the server 200 and the server 100 is that the server 200 uses high-power blades 210 and therefore requires more cooling than can be provided by natural convection. The server 200 therefore includes a modular fan assembly 224.

In the illustrated embodiment the chassis 201 is substantially like the chassis 101 and conforms to the ATCA form factor specification. The chassis 201 is a metal box with a perforated top 206, a perforated bottom 204 and four sidewalls 202. Within the chassis 201, a bottom plenum 205 is located below the components and a top plenum 203 is located above the electronic components. At least two of the sidewalls 202 include air vents 208 that allow cooling air into the bottom plenum. Other embodiments of the chassis 201, however, may have different configurations of air vents 208 in the sidewalls. Similarly, other embodiments of the chassis may be made of materials besides metals.

The electronic components include one or more individual servers, each built on a separate blade 210. Each blade 110 is a high-power blade, for example a blade and an RTM with a power consumption of 200 W. As before, "high power" means that its power consumption is at or above a certain threshold, which in one embodiment is set at 65 W, although in other embodiments the threshold that distinguishes a low-power blade from a high-power blade may be different. The blade 110 includes, for example, processor chipset 116 and a memory 118, which can be a volatile memory such as dynamic random access memory (DRAM) or synchronous dynamic random access memory (SDRAM), or can be a non-volatile memory such as flash read-only memory (ROM), disk storage, or other components. In one embodiment, the processors 216 can have heat sinks attached thereto to improve heat transfer. The blades 210 plug into a backplane 202, which functions as a sort of motherboard that connects the different blades together and manages communication between individual blades and exterior devices, as well as among the blades themselves. The optional RTM 214 provides optional connections and functionality separate from the backplane. The backplane 212, blades 210 and RTM 214 are vertically oriented in the chassis.

Since the server 200 includes high-power blades, natural convection no longer provides enough cooling to keep the blades at acceptable temperatures. Forced convection must therefore be used—hence, the addition of the modular fan assembly 224. The modular fan assembly 224 is placed on the perforated top plate 206 of the chassis. The modular fan assembly 224 is removably attached to the top of the chassis. The fan assembly can therefore be easily be removed if the blades 210 are swapped out and replaced with low-power blades so that forced convection is no longer necessary, and can easily be re-installed if low-power blades are replaced with high-power blades, making forced convection necessary. Both high and low power applications can be accommodated within the same form factor.

In operation, the blades 210 generate heat. The server 200 is cooled by air flowing through the chassis 201 by forced convection. The modular fan assembly 224 pulls cooling air 220 into the bottom plenum 205 through the side vents 208 and the perforated bottom 204, and draws the air upward so that it flows over the server blades 210. The cooling air 220 is heated as it passes over the blades 210 and becomes heated air 222. After flowing over the blades 210, heated air 222 enters the upper plenum 203, exits the chassis through perforated top 206, and enters the fan assembly plenum 226. The fan assembly 224 then expels the heated air 222 from the plenum 226 to the exterior.

Figure 3A:
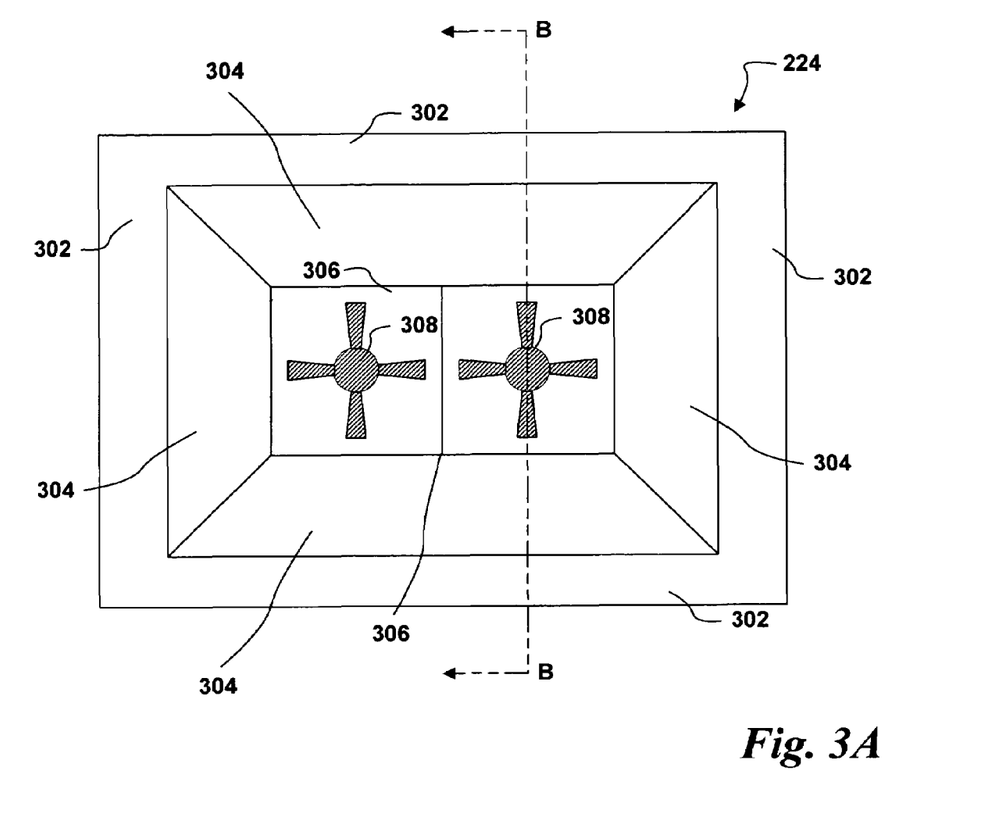
FIG. 3A is a plan view of an embodiment of a modular fan assembly.
Figure 3B:
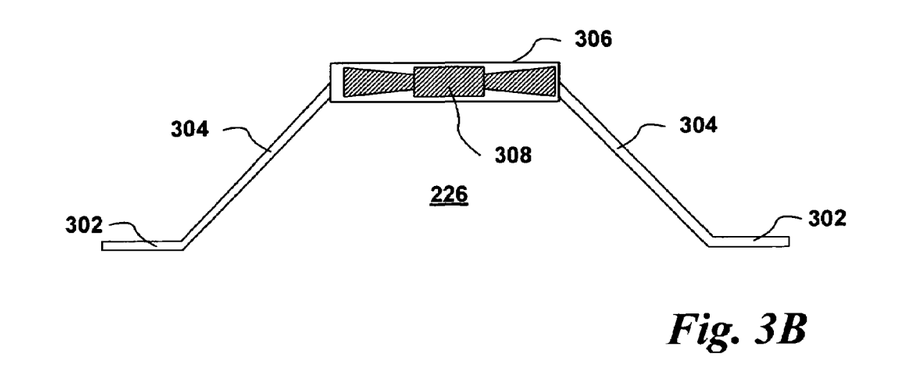
FIG. 3B is a side elevation of a modular fan assembly, taken substantially along the section line B—B in FIG. 3A.

FIGS. 3A and 3B illustrate an embodiment of the modular fan assembly 224 designed to be removably attached to a chassis such as the chassis 201. The fan assembly 224 substantially matches the shape of the perforated top 206 and includes four sloped sidewalls 304 extending between the fan housing 306 and a flange 302 that extends around the perimeter. The sloped sidewalls are connected to the fan housing 306 and to the flange 302, and such that the assembly 224 forms a plenum 226 when placed on a chassis. In the embodiment shown, the dimensions of the assembly 224 are designed to substantially match the size of the perforated top of a chassis, such as chassis 201. In other embodiments, the fan assembly may have a different configuration and size. For example, in one embodiment the fan assembly 224 could either completely omit the flange 302 or only have it along two opposite sides of the assembly. In other embodiments the sidewalls, and therefore the resulting plenum 226, could have a different shape or configuration.

Within the fan housing 306 are a pair of fans 308. The exact number of fans used and their sizes will depend on the cooling requirements, although use of at least two fans ensures sufficient cooling and also provides redundancy, so if one of the fans fails the other can continue to provide cooling. The fan combination can be connected in series or in parallel. For additional flexibility in cooling, the fans 308 have variable speeds, meaning that the amount of cooling air drawn through the chassis can be closely controlled. The fans can be controlled by a shelf management blade in the chassis or by some other means. The fans can obtain their power in different ways. In one embodiment, the fan assembly includes a connector that mates with a corresponding connector in the perforated top of a chassis, with power routed to the connector through a cable (see FIG. 4A). The cable can be connected to the chassis power supply, to the backplane, or to a blade. Where the fan speed is controlled by a shelf management blade, the cable can be connected to, and thus derive its power from, the shelf management blade. In other embodiments, however, power can be delivered to the fans in other ways. For example, a special power delivery blade could be constructed that would plug into the backplane and deliver power to the fans.

Figure 4A:
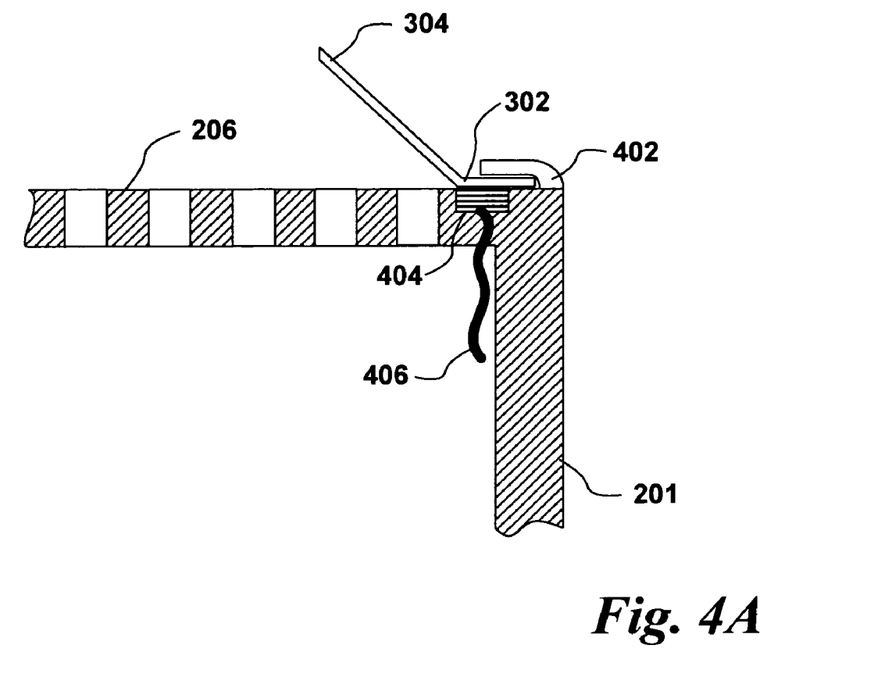
FIGS. 4A–4C are side view of different embodiments of a retention mechanism for attaching an embodiment of the modular fan assembly to a chassis.
Figure 4B:
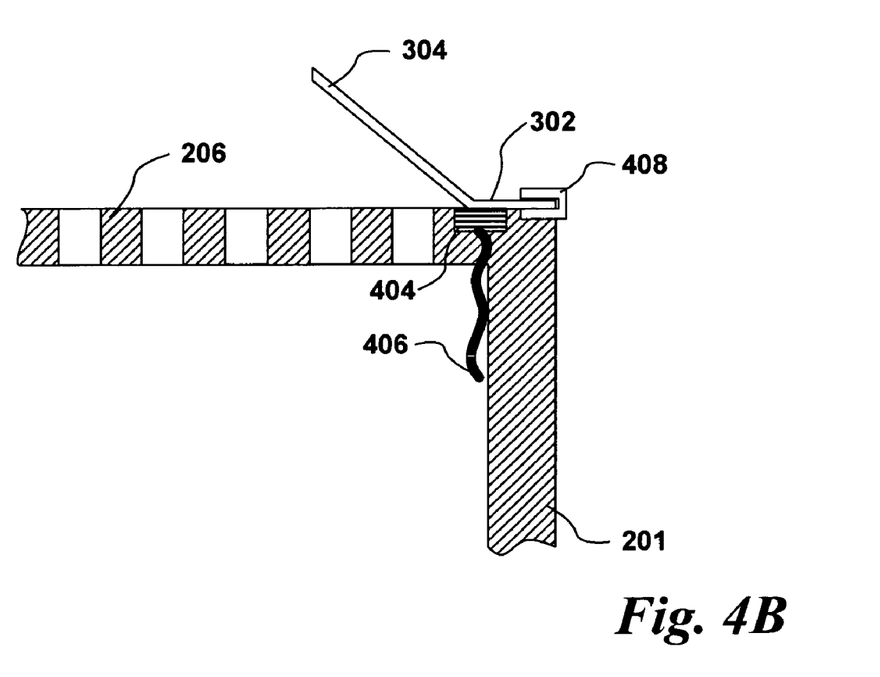
Figure 4C:
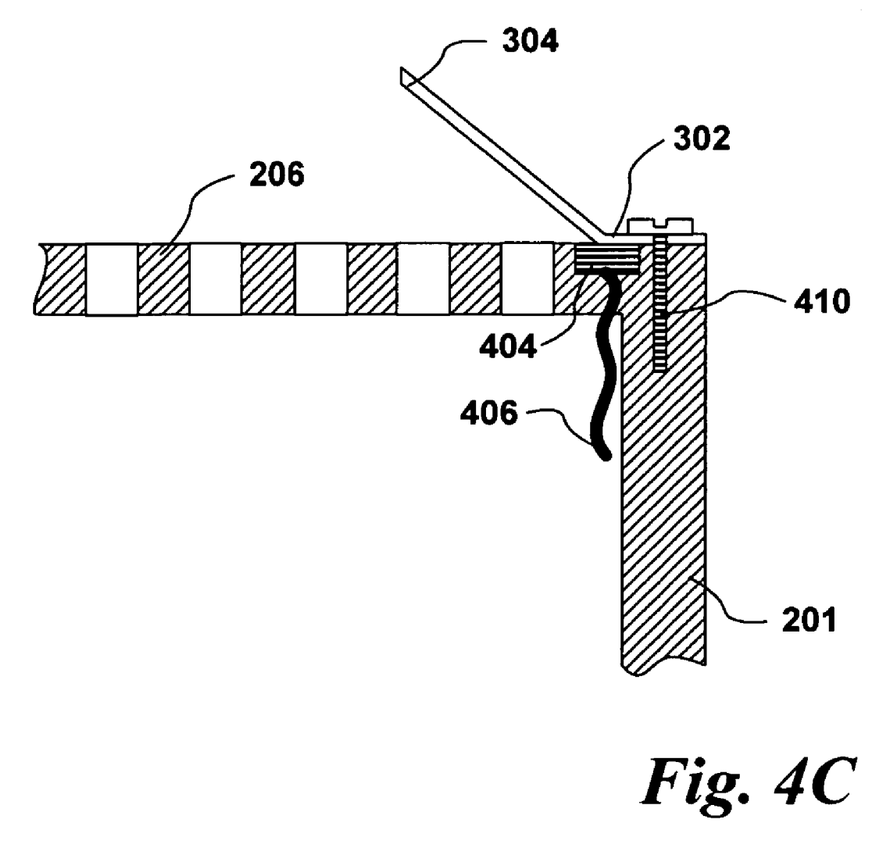

FIGS. 4A–4C illustrate various embodiments of ways to removably attach the modular fan assembly 224 to a chassis such as chassis 201. FIG. 4A illustrates the use of a rail 402 on the chassis 201. The rail 402 engages the flange 302 of the fan assembly; the space between the rail 402 and the perforated top 206 is designed to accommodate the thickness of the flange 302. Rails 402 are attached to at least two edges of the perforated top 206 of the chassis. With this arrangement, a modular fan assembly 224 can easily be slid onto the top of a chassis 201 when needed, and slid off the top of the chassis when not needed. When the fan assembly 224 is in place, a connector on the fan assembly engages connector 404, which in turn is connected to a power source via a cable 406. As explained in connection with FIGS. 3A–3B, the cable 406 can run adjacent to the wall of the chassis to the chassis power supply, or can be connected to the backplane or to a blade. Where the fan speed is controlled by a shelf management blade, the cable connect to, and thus derive its power from, the shelf management blade. In other embodiments, however, power can be delivered to the fans in other ways, for instance via a special power delivery blade that would plug into the backplane and deliver power to the fans.

FIG. 4B illustrates the use of clips 408 to removably attach the fan assembly to a chassis. Once the fan assembly 224 is in the desired position on top of perforated top 206 of the chassis, a plurality of clips 408 are used to secure the fan assembly in place. The clips 408 engage the chassis 201 and the flange 302, and function as clamps that hold the chassis and the flange together. FIG. 4C illustrates the use of a fastener to removably attach a fan assembly to the chassis. Once the fan assembly 224 is in the desired position on top of perforated top 206 of the chassis, a plurality of fasteners such as screw 410 can be used to secure the fan assembly in place. The flange 302 and the chassis 201 must have corresponding holes to accommodate the screw 410.

Figure 5:
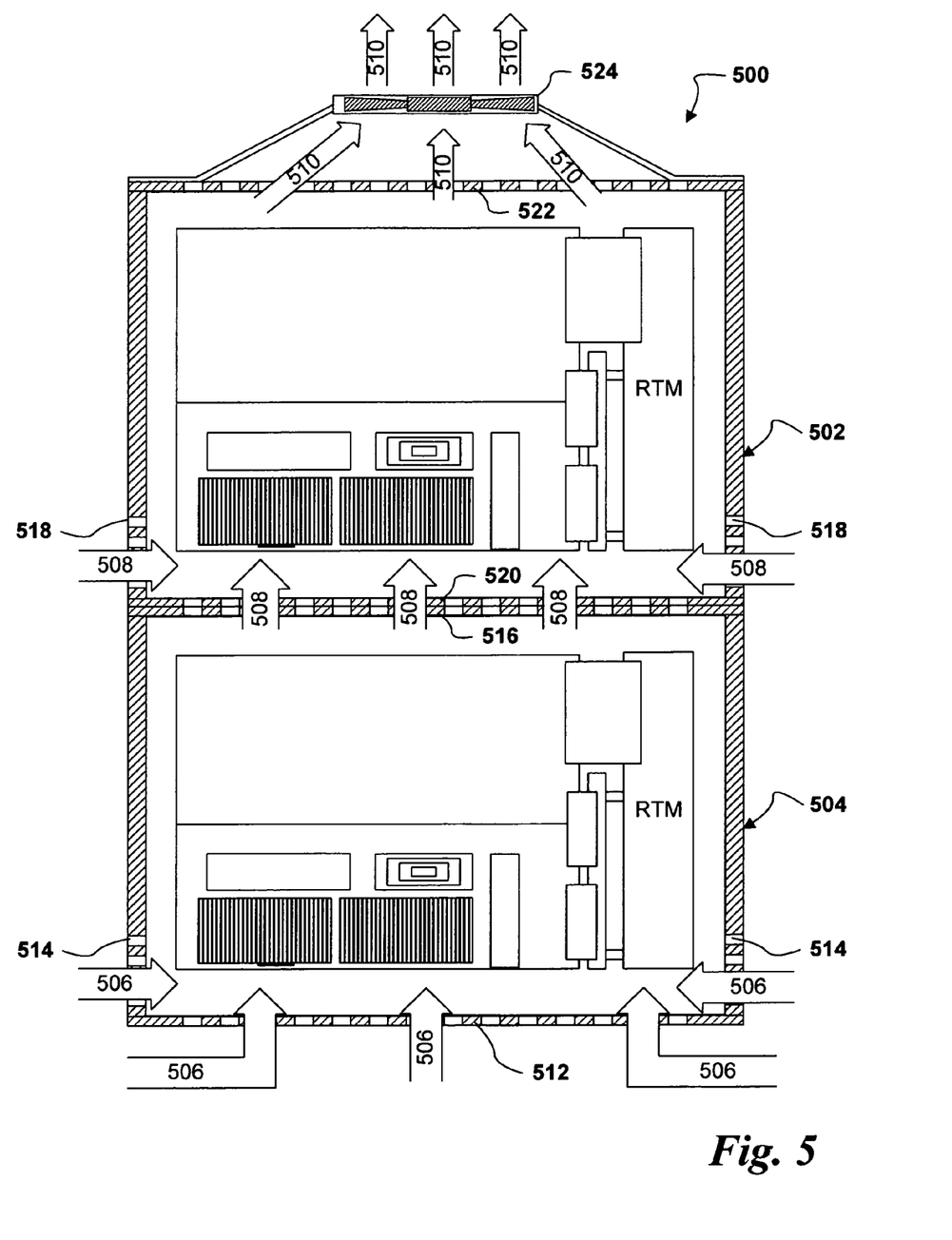
FIG. 5 is a side view of an embodiment of a pair of stacked servers according to the present invention.

FIG. 5 illustrates a chassis stack 500 embodying the present invention. The chassis stack 500 includes a top chassis 502 and a bottom chassis 504. In one embodiment, both the chassis 502 and the chassis 504 are substantially similar to the chassis 201 and include substantially the same electronic components, although in other embodiment different chassis and/or different electronic components can be used. In the stack 500, the top chassis 502 is positioned directly on top of the bottom chassis 504, so that the perforations in the perforated bottom 520 of the top chassis substantially align with the perforations in the perforated top 516 of the bottom chassis. A modular fan assembly 524 is removably attached to the top 522 of the top chassis 502. The design of the fan assembly 524 and the capacity of the fans in the assembly will be larger than when the fan assembly cools only one chassis, since the cooling requirements are now greater. In the illustrated embodiment there are only two chassis in the stack 500, but in other embodiments a different number of chassis can be stacked, provided that the elements of the modular fan assembly are adjusted according to the cooling requirements of the stack. As with the single chassis 201, in the chassis stack 500 the modular fan assembly 524 can be removed if low-power blades are used in each chassis so that natural convection provides adequate cooling for the stack.

In operation of the server stack 500, the blades inside chassis 502 and 504 generate heat. The modular fan assembly 524 draws cooling air 506 into the bottom chassis 504 through the side vents 514 and the perforated bottom 512, and draws the air upward so that it flows over the server blades 204. The cooling air 506 is heated as it passes over the blades and becomes heated air 508. After flowing over the blades in the bottom chassis, heated air 508 flows through the perforated top 516 of the bottom chassis and the perforated bottom 520 of the top chassis and enters the upper chassis 502, where it flows over the blades in the top chassis to become heated air 510. The heated air 510 exits the chassis through perforated top 522 of the top chassis, and enters the fan assembly. The fan assembly 524 then expels the heated air 510 from the plenum 226 to the exterior.

Although all the cooling schemes described above are discussed in terms of ATCA platforms, they can equally well be applied to non-ATCA platforms, such as micro-ATCA, AMC chassis, or other platforms.

Figure 6A:
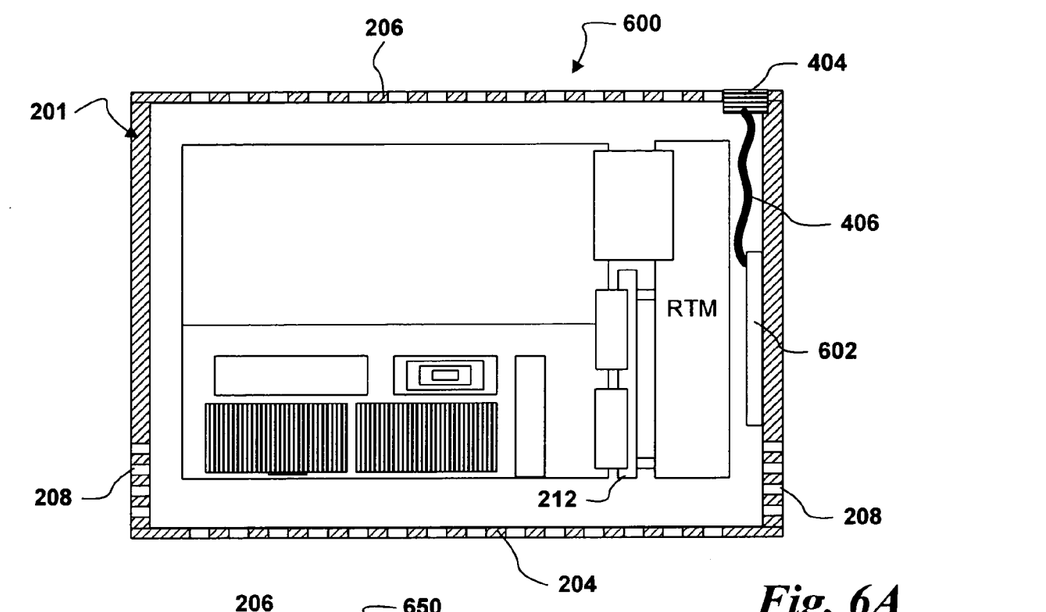
FIG. 6A is a side view of an embodiment of a server configured to provide power to a modular fan assembly by coupling to a chassis power supply.
Figure 6B:
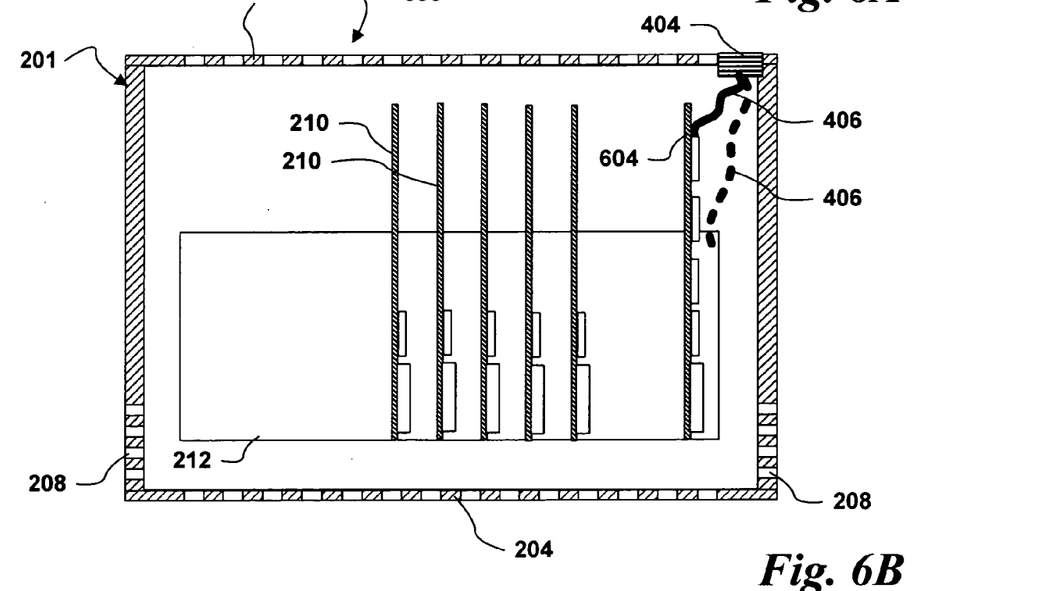
FIG. 6B is a front view of an embodiment of a server configured to provide power to a modular fan assembly through coupling to a backplane or a to a shelf management blade.

FIGS. 6A and 6B illustrate embodiments by which a chassis can be configured to deliver power to a fan assembly such as modular fan assembly 224 when the modular fan assembly 224 is mounted on the chassis. FIG. 6A illustrates an embodiment 600 in which a server such as server 200 has been equipped with a connector 404 to deliver power to modular fan assembly 224 when it is mounted (see FIGS. 4A–4C). Cable 406 runs from connector 404 to a chassis power supply 602, which in this embodiment is positioned within the chassis. FIG. 6B illustrates an alternative embodiment 650. In embodiment 650, a server such as server 200 has been equipped with a connector 404 to deliver power to modular fan assembly 224 when it is mounted (see FIGS. 4A–4C). Server 200 includes various vertically-oriented blades such as blades 210, and also includes a blade 604 to which connector 404 can be coupled by cable 406. In one embodiment, blade 604 can be a shelf-management blade that can control the fans in modular fan assembly 224, but in an alternative embodiment blade 604 can be a power delivery blade that simply delivers power to modular fan assembly 224. Alternatively, as shown by the dotted-line version of cable 406, connector 404 can be coupled directly to the backplane so that the connector 404, and hence modular fan assembly 224, can obtain power directly from the backplane.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
   a chassis comprising a box having a perforated top, a perforated bottom and four sidewalls, wherein at least two sidewalls have air vents therein near the bottom;
   a modular fan assembly removably coupled to the chassis on an exterior side of the perforated top; and
   a retention mechanism to removably secure the modular fan assembly to the chassis.

2. The apparatus of claim 1 wherein the modular fan assembly comprises:
   a fan plenum; and
   at least two redundant cooling fans coupled to the plenum.

3. The apparatus of claim 2 wherein the fans have variable speeds.

4. The apparatus of claim 3 wherein the chassis has therein a shelf management blade operatively coupled to the modular fan assembly to control the fan speeds.

5. The apparatus of claim 1 wherein the retention mechanism is selected from a group consisting of a plurality of rails, a plurality of fasteners, and a plurality of clips.

6. The apparatus of claim 1, further comprising a power connector to deliver power to the modular fan assembly.

7. The apparatus of claim 6 wherein power is delivered to the power connector by a cable in the interior of the chassis.

8. The apparatus of claim 7 wherein the cable is connected to a chassis power supply.

9. The apparatus of claim 7 wherein the cable is connected to a shelf management blade within the chassis.

10. The apparatus of claim 7 wherein the cable is connected to at least one blade within the chassis.

11. The apparatus of claim 6 wherein power is delivered to the power connector by at least one of the blades in the chassis.

12. An apparatus comprising:
a first chassis comprising a box having a perforated top, a perforated bottom and four sidewalls, wherein at least two sidewalls have air vents therein near the bottom;
a second chassis comprising a box having a perforated top, a perforated bottom and four sidewalls, wherein at least two sidewalls have air vents therein near the bottom, and wherein the second chassis is stacked on the first chassis so that the perforations in the perforated bottom of the second chassis align with the perforations in the perforated top of the first chassis;
a modular fan assembly removably coupled to the second chassis on an exterior side of the perforated top of the second chassis; and
a retention mechanism to removably secure the modular fan assembly to the second chassis.

13. The apparatus of claim 12 wherein the modular fan assembly comprises:
a fan plenum; and
at least two redundant cooling fans coupled to the plenum.

14. The apparatus of claim 13 wherein the fans have variable speeds.

15. The apparatus of claim 14 wherein the second chassis has a shelf management blade therein operatively coupled to the modular fan assembly to control the fan speeds.

16. The apparatus of claim 12 wherein the retention mechanism is selected from a group consisting of a plurality of rails, a plurality of fasteners, and a plurality of clips.

17. The apparatus of claim 12, further comprising a power connector to deliver power to the modular fan assembly.

18. The apparatus of claim 17 wherein power is delivered to the power connector by a cable in the interior of the chassis.

19. The apparatus of claim 17 wherein power is delivered to the power connector by at least one of the blades in the chassis.

20. A system comprising:
a chassis comprising a box having a perforated top, a perforated bottom and four sidewalls, wherein at least two sidewalls have air vents therein near the bottom;
a backplane in the interior of the chassis;
a plurality of blades couple thereto, at least one of the blades being a server including a processor and an SDRAM memory;
a modular fan assembly removably coupled to the chassis on an exterior side of the perforated top; and
a retention mechanism to removably secure the modular fan assembly to the chassis.

21. The system of claim 20 wherein the modular fan assembly comprises:
a fan plenum; and
at least two redundant cooling fans coupled to the plenum.

22. The system of claim 21 wherein the fans have variable speeds.

23. The system of claim 22, further comprising a shelf management blade coupled to the backplane and operatively coupled to the modular fan assembly to control the fan speeds.

24. The system of claim 20 wherein the retention mechanism is selected from a group consisting of a plurality of rails, a plurality of fasteners, and a plurality of clips.

25. The system of claim 20, further comprising a power connector to deliver power to the modular fan assembly.

26. The system of claim 25 wherein power is delivered to the power connector by a cable in the interior of the chassis.

27. The system of claim 25 wherein power is delivered to the power connector by at least one of the blades in the chassis.

28. A process comprising:
providing a chassis including one or more server blades therein, each server blade having a power consumption;
if the power consumption of each blade is below a threshold power consumption, cooling the blades using natural convection; and
if the power consumption of each blade is above a threshold power consumption, cooling the blades using forced convection by removably coupling a modular fan assembly to an exterior side of a perforated top of the chassis.

29. The process of claim 28 wherein removably coupling the modular fan assembly to a perforated top of the chassis comprises attaching the modular fan assembly using a retention mechanism.

30. The process of claim 29 wherein the retention mechanism is selected from a group consisting of a plurality of rails, a plurality of fasteners, and a plurality of clips.

31. The process of claim 28 wherein the modular fan assembly comprises:
a fan plenum; and
at least two redundant cooling fans coupled to the plenum.

32. The process of claim 31 wherein the fans have variable speeds.

33. The process of claim 32, further comprising a shelf management blade coupled to the backplane and operatively coupled to the modular fan assembly to control the fan speeds.

* * * * *